US008264125B2

(12) United States Patent
Denzler et al.

(10) Patent No.: US 8,264,125 B2
(45) Date of Patent: Sep. 11, 2012

(54) PIEZOELECTRIC COMPONENT COMPRISING A SECURITY LAYER AND AN INFILTRATION BARRIER AND A METHOD FOR THE PRODUCTION THEREOF

(75) Inventors: Michael Denzler, Regensburg (DE); Christoph Hamann, Thalmassing (DE); Harald Johannes Kastl, Fichtelberg (DE); Stefan Kohn, Hohenburg (DE); Maximilian Kronberger, Steyr (AT); Christian Reichinger, Neutraubling (DE); Carsten Schuh, Baldham (DE); Claus Zumstrull, Regenstauf (DE)

(73) Assignee: Siemens Aktiengesellschaft, Munich (DE)

( * ) Notice: Subject to any disclaimer, the term of this patent is extended or adjusted under 35 U.S.C. 154(b) by 401 days.

(21) Appl. No.: 12/593,375

(22) PCT Filed: Mar. 26, 2008

(86) PCT No.: PCT/EP2008/053540
§ 371 (c)(1),
(2), (4) Date: Sep. 28, 2009

(87) PCT Pub. No.: WO2008/119702
PCT Pub. Date: Oct. 9, 2008

(65) Prior Publication Data
US 2010/0102138 A1 Apr. 29, 2010

(30) Foreign Application Priority Data

Mar. 30, 2007 (DE) .......................... 10 2007 015 446

(51) Int. Cl.
*H01L 41/04* (2006.01)
*H01L 41/08* (2006.01)

(52) U.S. Cl. ........ 310/328; 310/364; 310/365; 310/366; 123/472
(58) Field of Classification Search ................. 310/328, 310/364–366; 123/472
See application file for complete search history.

(56) References Cited

U.S. PATENT DOCUMENTS

| 6,661,158 | B2 * | 12/2003 | Kawazoe ....................... 310/328 |
| 7,288,875 | B2 * | 10/2007 | Kadotani et al. ............... 310/328 |
| 7,358,655 | B2 | 4/2008 | Ragossnig et al. |
| 7,646,266 | B2 | 1/2010 | Igaki et al. .................... 333/195 |
| 7,791,256 | B2 * | 9/2010 | Nakamura .................... 310/364 |

(Continued)

FOREIGN PATENT DOCUMENTS
DE 10307825 A1 9/2004
(Continued)

OTHER PUBLICATIONS
International Search Report PCT/EP2008/053540, 12 pages, Jul 29, 2008.
(Continued)

Primary Examiner — Jaydi San Martin
(74) Attorney, Agent, or Firm — King & Spalding L.L.P.

(57) ABSTRACT

A piezoelectric component with a monolithic stack, has electrode layers and piezoceramic layers arranged alternately one on top of the other, the piezoceramic layers have a piezoceramic, and having at least one porous security layer arranged in the stack for the formation of a crack if mechanical overload of the stack should occur. The piezoelectric component has an infiltration barrier arranged between the security layer and a lateral surface section of the stack for suppressing the penetration of a foreign substance into the security layer. The piezoelectric component can be as a piezoactuator for controlling a valve, particularly a valve of an internal combustion engine.

17 Claims, 2 Drawing Sheets

U.S. PATENT DOCUMENTS

| | | | |
|---|---|---|---|
| 7,982,373 B2 * | 7/2011 | Doellgast et al. | 310/366 |
| 2002/0153431 A1 * | 10/2002 | Sato et al. | 239/102.1 |
| 2005/0249928 A1 | 11/2005 | Lubitz et al. | 428/210 |
| 2006/0238073 A1 | 10/2006 | Ragossnig et al. | 310/326 |
| 2008/0018417 A1 | 1/2008 | Igaki et al. | 333/195 |
| 2010/0139621 A1 * | 6/2010 | Murai et al. | 123/472 |

FOREIGN PATENT DOCUMENTS

| | | | |
|---|---|---|---|
| DE | 102004031404 A1 | 2/2006 | |
| DE | 102004050803 A1 | 4/2006 | |
| EP | 1764844 A1 | 3/2007 | |
| JP | 2006/512750 A | 4/2006 | |
| JP | 20061518934 A | 8/2006 | |
| WO | WO 03105246 A2 | 12/2003 | |
| WO | WO 2006131106 A2 | 12/2006 | |

OTHER PUBLICATIONS

Japanese Office Action, Japanese Patent Application No. 2009-553166, 6 pages.

* cited by examiner

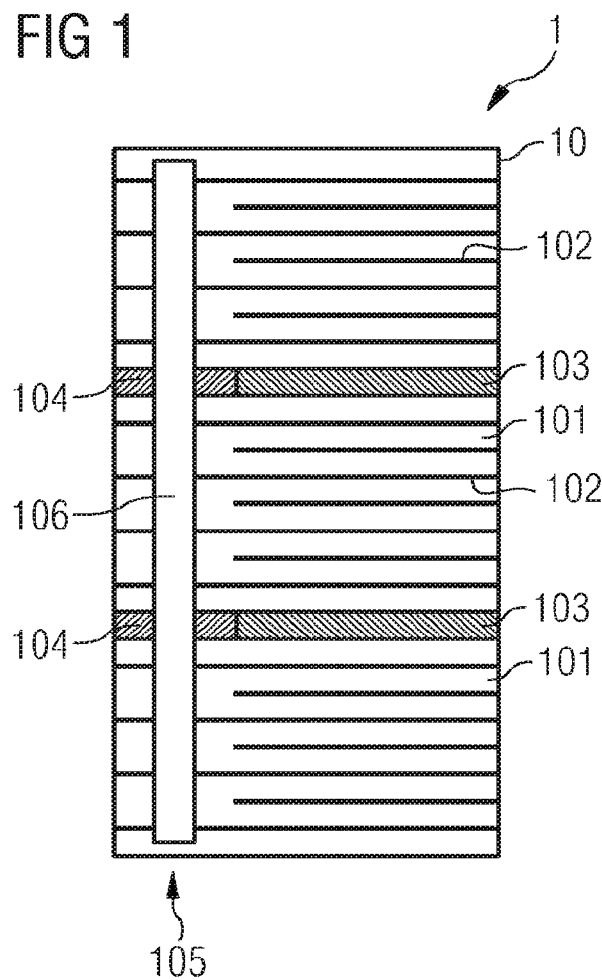
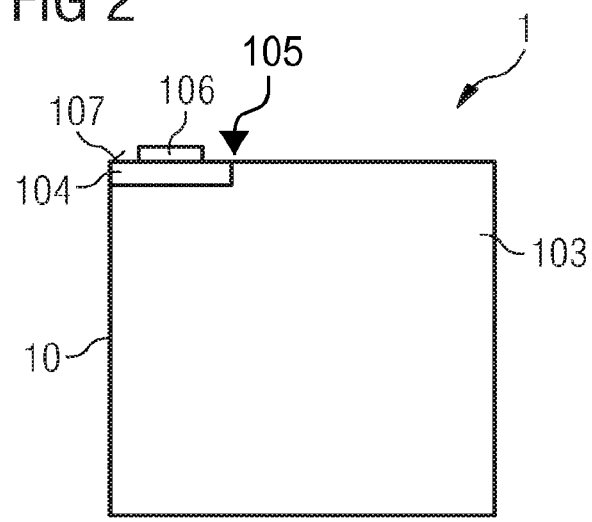

//  PIEZOELECTRIC COMPONENT COMPRISING A SECURITY LAYER AND AN INFILTRATION BARRIER AND A METHOD FOR THE PRODUCTION THEREOF

CROSS-REFERENCE TO RELATED APPLICATIONS

This application is a U.S. National Stage Application of International Application No. PCT/EP2008/053540 filed Mar. 26, 2008, which designates the United States of America, and claims priority to German Application No. 10 2007 015 446.3 filed Mar. 30, 2007, the contents of which are hereby incorporated by reference in their entirety.

TECHNICAL FIELD

The invention relates to a piezoelectric component with a monolithic stack, comprising piezoceramic layers and electrode layers arranged alternately one on top of the other, with a piezoceramic and at least one porous security layer arranged in the stack for the purpose of forming a crack if there is mechanical overload of the stack. In addition, a method for the production of the component is specified.

BACKGROUND

The piezoelectric component is a ceramic piezoactuator with a monolithic multilayer construction. Some forms of embodiment of such multilayer actuators have porous ceramic or metallic security layers (security structures). The porous security layers act as predetermined breakage points: If there is a mechanical overload of the piezoactuator's stack, any cracks (polarizing cracks) tend to form in these security layers. By this means, the location of polarizing cracks arising in the event of polarization or in operation can be defined and channeled. These security layers can be formed from ceramic layers or from electrode layers (internal electrodes) with an increased porosity.

For making electrical contact, the internal electrodes have electrical leads to alternate lateral surface sections of the stack which are electrically insulated from each other. Applied to these surface sections are metallic coatings (external metallic coatings). Alternate internal electrodes are electrically connected in parallel via these metallic coatings.

The stack of the piezoactuator is provided with a plastic sheathing made of silicone. This plastic sheathing serves to passivate the stack. This means that the internal electrodes, which extend out to the lateral surfaces of the stack, are electrically insulated and protected against mechanical destruction by the plastic sheathing.

When the metallic coatings are being applied and when the silicone is being applied to the surface of the stack, penetration of metal, melted glass (adhesion agent of the metallic coatings) and silicone components into the porous security layer can occur. An infiltration of the said substances occurs. As a result of this infiltration an undesired electrical conductivity of the security layer or a mechanical compression stress can occur, which can be accompanied by damage to the security layer and its surroundings. This could result in a premature failure of the component.

SUMMARY

According to various embodiments any penetration of foreign material into the porous security layer during the production of a piezoelectric component with a monolithic stack can be prevented.

According to an embodiment, a piezoelectric component with a monolithic stack may have electrode layers and piezoceramic layers arranged alternately one on top of the other, at least one porous security layer arranged in the stack for the purpose of forming a crack if there is mechanical overload of the stack, and, arranged between the security layer and a lateral surface layer of the stack, an infiltration barrier for suppressing penetration of a foreign substance into the security layer.

According to a further embodiment, the infiltration barrier may surround the security layer. According to a further embodiment, the infiltration barrier can be arranged in a piezoelectrically-inactive contacting area of the stack. According to a further embodiment, the infiltration barrier may have a dimension that is smaller than a dimension of the contacting area. According to a further embodiment, the infiltration barrier may feature a barrier material intrinsic to piezoceramic.

According to another embodiment, a method for producing a stack of the piezoelectric component as described above, may comprise the following process steps: a) Alternate arrangement one above the other of ceramic green foils and metallic layers to form a green foil composite, with at least one precursor layer of the security layer being integrated into the green foil composite, and b) Heat treatment of the green foil layer to form a monolithic stack, wherein the piezoceramic layers being created from the ceramic green foils, the electrode layers from the metallic layers, the security layer from the precursor layer of the security layer, and wherein the infiltration barrier is formed.

According to a further embodiment, the heat treatment may be interrupted for forming the infiltration barrier and the following further method steps being performed: c) Infiltration of barrier material on a lateral surface section of the partly sintered stack and d) Continuation of the heat treatment so that the infiltration barrier is formed from the barrier material.

According to a further embodiment, a method selected from the group sol-gel process, slip process, spraying and dipping can be used. According to a further embodiment, the further method steps can be performed before the arrangement of the ceramic green foils and the metallic layers one on top of the other: e) Provision of a ceramic green foil and f) Arrangement of the precursor layer of the security layer. According to a further embodiment, in addition to the arrangement of the precursor layer of the security layer, an arrangement of a preliminary stage of the infiltration barrier on the green foil can be undertaken.

According to yet another embodiment, a use of a piezoelectric component, as claimed described above, may comprise actuation of a valve and, in particular, an injection valve in an internal combustion engine.

BRIEF DESCRIPTION OF THE DRAWINGS

The invention is explained in more detail below by reference to a number of exemplary embodiments and the associated figures. The figures are schematic and do not represent true-to-scale diagrams.

FIG. 1 shows a monolithic stack of a piezoelectric component, from the side.

FIG. 2 shows a section through the stack at the level of a security layer

DETAILED DESCRIPTION

Figure 3:
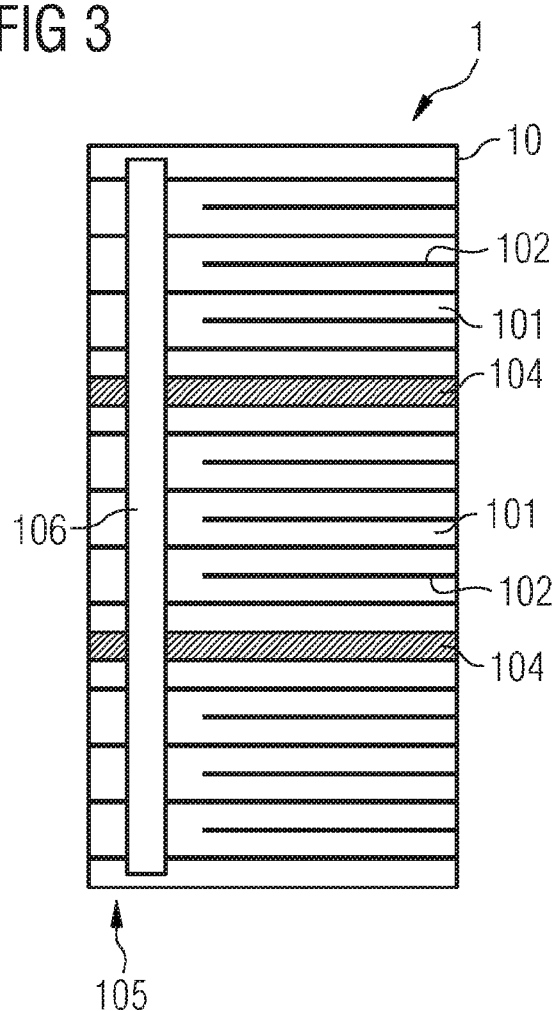
FIG. 3 shows a further embodiment of a stack of a piezoelectric component from the side

According to various embodiments, a piezoelectric component with a monolithic stack can be specified which has electrode layers and piezoceramic layers with a piezoceramic arranged alternately one on top of the other and at least one porous security layer arranged in the stack for the formation of a crack in the event of mechanical overload of the stack. The piezoelectric component is characterized by the fact that an infiltration barrier to prevent penetration of a foreign substance into the security layer is arranged between the security layer and a lateral section of the surface of the stack.

To achieve this object, a method for the production of the stack of the piezoelectric component is also provided, having the following process steps: a) Alternating arrangement one above the other of ceramic green foils and metallic layers into a foil green foils compound, with at least one base layer of the security layer being integrated into the green foil composite and b) Heat treatment of the green foils composite into a monolithic stack, with the piezoceramic layer being produced from the ceramic green foils, the electrode layers being produced from the metallic layers and the security layer being produced from the precursor layer of the security layer and the infiltration barrier being formed.

The underlying idea of the various embodiments is to protect the porous security layer from being penetrated by foreign substances. This is successfully implemented with the infiltration barrier. The infiltration barrier forms one edge of the stack. The infiltration barrier preferably does not exhibit any open porosity. This prevents foreign substances being able to penetrate it. The infiltration barrier represents a sealed edge area.

In a particular embodiment the infiltration barrier surrounds the security layer. The security layer is not embodied to cover the full surface of an entire stack cross section. There remains a narrow edge area running all around extending to the lateral surfaces of the stack.

In a further embodiment the infiltration barrier is arranged in a piezoelectrically inactive contact area of the stack. In the contact area each second inner electrode is routed on a shared lateral section of the surface. This is where the electrical contacting of the inner electrodes via the outer metallic coating applied to the surface section occurs. A comb-type structure of the inner electrodes is embodied. This is also referred to as a multilayer capacitor structure. By comparison with a piezoelectrically-active area, which lies directly between electrode layers of different polarity, this type of contacting leads to a markedly different electrical field being coupled into the piezoceramic in the contacting area. This is the main reason for the crack formation occurring during the polarizing and during operation.

Without an infiltration barrier foreign substances can penetrate into the porous security layer during the application of the metallic coating. For example electrically-conductive material of the metallic coating infiltrates the barrier. The result would be an undesired electrical conductivity in the contacting area. The operability of the component could not be guaranteed. However the infiltration barrier prevents electrically-conductive material being able to penetrate. The function of the component is ensured.

Preferably the infiltration barrier has dimensions in such cases which are smaller than the dimensions of the contacting areas. The infiltration barrier forms the edge of the contacting area through to the lateral surface section to which the metallic coating is applied. The dimension of the infiltration barrier is for example a depth of the infiltration barrier. A depth of the contacting area is larger than a depth of the infiltration area. Preferably the depth of the contacting area is much greater than the depth of the infiltration barrier. For example the ratio of the depth of the contacting area is four or more times the depth of the infiltration barrier.

The fact that only a small edge area is formed by the infiltration barrier means that a desired crack initiation and a desired crack progression in the security layer are not negatively influenced. At the same time it is ensured that foreign substances, for example fluid materials in the production process, do not penetrate into the security layer and cannot cause damage there.

In accordance with a particular embodiment of the method the heat treatment is interrupted to form the infiltration barrier and the following further method steps are undertaken: c) Infiltration of barrier material on a lateral surface section of the partly sintered stack and d) Continuation of the heat treatment so that the infiltration barrier is formed from the barrier material.

The interruption means that only one sintering of the stack can have been undertaken, so that a partly sintered stack is available. In addition it is also conceivable to perform the sintering completely and after the sintering to undertake the infiltration with subsequent heat treatment, i.e. on the completely sintered stack.

Preferably for infiltration of the barrier material a method is selected from the group sol-gel process, slip process, spraying and dipping. Alternate technologies are also possible in this case, for example painting on the barrier material with a brush.

In a particular embodiment of the infiltration barrier features a barrier material intrinsic to piezoceramic, the barrier material in this case is of the same type as the piezoceramic of the green foils of the stack and composite all the piezoceramic of the piezoceramic layers, for example a lead-zirconite titanate (PZT) is used as the piezoceramic. The barrier material is likewise a lead-zirconite titanate. In this case it is also conceivable that the barrier layer to be formed by the piezoceramic of the adjoining piezoceramic layers, alternate materials, for example Zirconium oxide, are likewise conceivable. It is important for tightly sealed edge area to be produced by the infiltration of the barrier material and subsequent heat treatment with the result that during the processing of the stack no infiltration of foreign substances can occur.

In a further embodiment before the arrangement one above the other of the ceramic green foils and the metallic layers the following further method steps are undertaken: e) Provision of a ceramic green foil and f): Arrangement of the precursor layer of the security layer. To arrange the precursor layer for example a paste is imprinted onto the green foils, the process in this case can be that the paste is not applied over the entire surface of the green foils. One edge remains. If a further green foil is now arranged on the green foil precursor layer composite and the resulting composite is sintered the piezoceramic of the green foil and the piezoceramic of the further green foil are connected. An infiltration barrier is produced from the piezoceramic of the adjoining piezoceramic layers. The process described functions all the better the thinner the precursor layer of the security layer is.

In a further embodiment, in addition to the arrangement of the precursor layer of the security layer, an arrangement of a preliminary stage of the infiltration barrier on the green foils is undertaken. This method is suitable for the case in which the barrier material of the infiltration barrier differs from the piezoceramic of the piezoceramic layers. But here too an intrinsic material can be used.

The arrangement of the precursor layer and a preliminary stage is undertaken using conventional methods, for example screen printing. The structure is applied to the green foil from which the security layer and the infiltration barrier will be formed. This structure can be created by a corresponding imprinting or masking out during screen printing or during the removal of the (ceramic or metallic) security layer material.

The piezoelectric component described, with its stack made as a monolithic multilayer construct, will preferably be used for actuating a valve, and in particular for actuating an injection valve in an internal combustion engine.

In summary, the invention provides the following significant advantages:

With the aid of the infiltration barrier, penetration of foreign substances into a security layer during the production of the stack of the piezoelectric component is suppressed.

The function of the security layer, i.e. the control of crack formation and crack growth, is retained.

Undesired consequences of an infiltration, for example an increased electrical conductivity, are avoided.

The piezoelectric component 1 is a monolithic piezoactuator with a multilayer construction (FIGS. 1 and 2). This multilayer construction piezoactuator has a stack 10 of alternating piezoceramic layers 101 and electrode layers 102 arranged one on top of another. The piezoceramic layers incorporate lead zirconate titanate. The electrode layers are formed of a palladium-silver alloy. Porous security layers 103 are built into the stack. In accordance with a first form of embodiment, the security layer is ceramic in nature. In an alternative form or embodiment to this, the security layer is formed of a metallic layer. In both forms of embodiment, the security layer has a raised porosity by comparison with the rest of the stack. The result of this is that the security layer acts as a predetermined breakage point: in the event of mechanical overload of the stack, cracks will appear preferentially in this security layer with its increased porosity. It is thereby possible to control the formation and propagation of the crack.

Arranged on a section 107 of the lateral surface of the stack there is a metallic coating 106 for making electrical contact with the electrode layers 102 in the stack 10. Only one metallic coating is indicated in each of the figures. In fact at least one further metallic coating is present. Via these two metallic coatings the electrode layers 102 can alternately have different electrical potentials applied to them.

Arranged in the contacting area 105 is an infiltration barrier 104 between the security layer 103 and the lateral surface section 107. The infiltration barrier 104 is towards the lateral surface section 107 of the stack 10. The infiltration barrier 104 forms an edge area of the stack 10. The infiltration barrier 102 is characterized by an increased density so that the penetration of foreign substances into the porous security layer 103 is prevented. The function of the security layer 103 is thus maintained.

Figure 4:
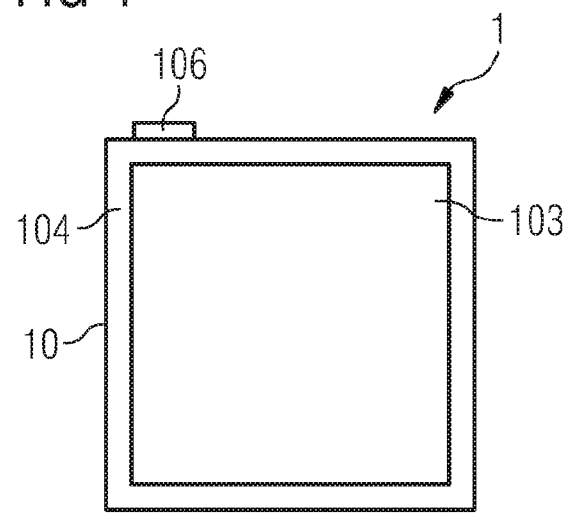
FIG. 4 shows a section at the level of a security layer.

In accordance with a further exemplary embodiment the infiltration barrier 104 completely surrounds the security layer 103 (FIGS. 3 and 4). The security layer 103 is never taken up to the lateral surface section 107 of the stack 10.

To produce the monolithic stack ceramic green foils are given a metallic overprint, are stacked one on top of another to form a green foil composite, are debindered and sintered to form the monolithic stack. The green foils produce the piezoceramic layers. The electrode layers result from the overprinted metal (metallic layers). Also integrated into the green foil composite is a precursor layer for the security layer, from which the security layer is formed during the sintering process.

For integration of the infiltration barrier, after the sintering a barrier material is infiltrated into the edge area of the porous security layer present after sintering. The barrier material is intrinsic PZT.

In accordance with a further embodiment the composite is merely sintered on, i.e. not completely sintered or compressed. The sinter process is interrupted and the barrier material infiltrated. After the infiltration the sinter process is continued. The infiltration barrier forms during this process.

For integration of the infiltration barrier, in accordance with an alternate embodiment the precursor layer of the security layer and a preliminary stage of the infiltration barrier are applied to a green foil. They are applied by screen printing. The printed green foil is stacked together with other green foils, laminated, debindered and sintered. During this heat treatment the infiltration barrier is produced from the preliminary layer.

In accordance with a further embodiment the arrangement of the preliminary stage of the infiltration barrier is dispensed with. A green foil is merely printed with the thin precursor layer of the security layer, with an edge area of the green foils remaining unprinted. Subsequent stacking with further green foils and sintering leads to the piezoceramic of the green foil being joined to the one directly adjacent green foils. An infiltration barrier is produced from the piezoceramic of the piezoceramic layers.

What is claimed is:

1. A piezoelectric component with a monolithic stack, comprising:
    electrode layers and piezoceramic layers arranged alternately one on top of the other,
    at least one porous security layer arranged in the stack for the purpose of forming a crack if there is mechanical overload of the stack, and
    an infiltration barrier arranged between the security layer and a lateral surface layer of the stack for suppressing penetration of a foreign substance into the security layer.

2. The component according to claim 1, wherein the infiltration barrier surrounds the security layer.

3. The component according to claim 1, wherein the infiltration barrier is arranged in a piezoelectrically-inactive contacting area of the stack.

4. The component according to claim 3, wherein the infiltration barrier has a dimension that is smaller than a dimension of the contacting area.

5. The component according to claim 1, wherein the infiltration barrier comprises a barrier material intrinsic to piezoceramic.

6. A method for producing a stack of the piezoelectric component, comprising the following process steps:
    alternate arrangement one above the other of ceramic green foils and metallic layers to form a green foil composite, wherein at least one precursor layer of a security layer is integrated into the green foil composite, and
    heat treatment of the green foil layer to form a monolithic stack, wherein the piezoceramic layers are created from the ceramic green foils, the electrode layers are created from the metallic layers, the security layer is created from the precursor layer of the security layer, and wherein an infiltration barrier is formed.

7. The method according to claim 6, wherein the heat treatment is interrupted for forming the infiltration barrier and the following further method steps being performed:
    infiltration of barrier material on a lateral surface section of the partly sintered stack, and
    continuation of the heat treatment so that the infiltration barrier is formed from the barrier material.

8. The method according to claim 7, wherein the infiltration of the barrier material is achieved by at least one of a sol-gel process, a slip process, spraying, and dipping.

9. The method according to claim 6, wherein further method steps are performed before the arrangement of the ceramic green foils and the metallic layers one on top of the other:
    provision of a ceramic green foil, and
    arrangement of the precursor layer of the security layer.

10. The method according to claim 9, wherein, in addition to the arrangement of the precursor layer of the security layer, an arrangement of a preliminary stage of the infiltration barrier on the green foil is undertaken.

11. A method for using of a piezoelectric component according to claim 1, comprising the step of actuating a valve in an internal combustion engine.

12. The method according to claim 11, wherein the valve is an injection valve.

13. An injection valve for an internal combustion engine comprising a piezoelectric monolithic stack comprising:
- alternately arranged electrode layers and piezoceramic layers to form said monolithic stack,
- at least one porous security layer arranged in the stack for the purpose of forming a crack if there is mechanical overload of the stack, and
- an infiltration barrier arranged between the security layer and a lateral surface layer of the stack for suppressing penetration of a foreign substance into the security layer.

14. The injection valve according to claim 13, wherein the infiltration barrier surrounds the security layer.

15. The injection valve according to claim 13, wherein the infiltration barrier is arranged in a piezoelectrically-inactive contacting area of the stack.

16. The injection valve according to claim 13, wherein the infiltration barrier has a dimension that is smaller than a dimension of the contacting area.

17. The injection valve according to claim 13, wherein the infiltration barrier features a barrier material intrinsic to piezoceramic.

* * * * *